United States Patent [19]
Ogura

[11] Patent Number: 5,440,423
[45] Date of Patent: Aug. 8, 1995

[54] OPTICAL ILLUMINATION INSTRUMENT
[75] Inventor: Yukio Ogura, Tokyo, Japan
[73] Assignee: NEC Corporation, Japan
[21] Appl. No.: 179,156
[22] Filed: Jan. 10, 1994
[30] Foreign Application Priority Data Jan. 20, 1993 [JP] Japan .................... 5-007122

[51] Int. Cl.⁶ .................... G02B 5/10; G02B 17/06; B23K 26/00; G03B 21/28
[52] U.S. Cl. .................... 359/365; 359/853; 359/858; 359/861; 355/53; 355/67; 362/298; 219/121.74
[58] Field of Search ............... 359/364, 365, 530, 546, 359/627, 628, 850, 851, 852, 853, 857, 858, 861, 869, 424, 428; 355/53, 67; 362/297, 298, 302, 304; 353/99; 219/121.74

[56] References Cited
U.S. PATENT DOCUMENTS

| 1,987,357 | 1/1935 | Bergen et al. | 359/546 |
| 2,036,146 | 3/1936 | Kampfer | 359/546 |
| 4,389,115 | 6/1983 | Richter | 355/67 |
| 4,484,334 | 11/1984 | Pressley | 359/867 |
| 4,518,232 | 5/1985 | Dagenais | 219/121.74 |
| 4,692,583 | 9/1987 | Kimura et al. | 219/121.74 |
| 4,806,724 | 2/1989 | Kawai et al. | 219/121.74 |
| 5,148,326 | 9/1992 | Hohberg | 359/853 |
| 5,245,454 | 9/1993 | Blonder | 359/850 |
| 5,285,320 | 2/1994 | Hohberg | 359/864 |

FOREIGN PATENT DOCUMENTS 0042703  3/1985  Japan .................... 359/868

Primary Examiner—Ricky D. Shafer
Attorney, Agent, or Firm—Laff, Whitesel, Conte & Saret

[57] ABSTRACT

In an optical illumination instrument for use in photolithographic process of manufacturing semiconductor devices, a reflection type homogenizer is composed of an array of paraboloid mirrors of a same size arranged on a same plane.

2 Claims, 3 Drawing Sheets

21 ARRAY OF PARABOLOID MIRROR
22 FOCAL SURFACE 32
31 PARABOLOID MIRROR

OPTICAL ILLUMINATION INSTRUMENT

BACKGROUND OF THE INVENTION

This invention relates to an optical illumination instrument, and more particularly an optical illumination instrument used in photolithographic process of manufacturing semiconductor devices.

FIG. 4 is a schematic diagram showing an assembly of an optical illumination instrument of prior art. A light source 41 comprising a mercury lamp or an exima laser emits light beam, and the emitted light beam is collimated to parallel light beam of a suitable size by a light beam transformer 42. The transformed light beam is homogenized by a homogenizer 43 comprising an array of a number of small lenses. An array of secondary light sources 44 is formed in a plane after the light beam is transmitted through the homogenizer 43, a secondary light source being formed at a focal point of each small lense.

A reticle 46 is illuminated by homogenized light beam through an illumination lense 45. Light beam transmitted through the reticle 44 is focused on an wafer 48 by a focusing lense 47.

Uniformly illuminated image of the reticle 46 is formed on the wafer 48 in a reduced dimension, and images of secondary light sources 44 are focused near an iris of the focusing lense 47.

This type of homogenizer 43 is used in an invention published on Japanese Patent Publication No. 13686/92. In a Japanese Patent Application which was laid open under Provisional Publication No. 147708/83, a pair of homogenizers(called integrator) are arranged in tandem in a light path so as to compensate non-homogeneity remained in a preceding homogenizer by a succeeding homogenizer.

In a Japanese Patent Application which was laid open under Provisional Publication No. 319727/89, and in a Japanese Patent Application which was laid open under Provisional Publication No. 166783/90, a light beam is divided into two parts by a half mirror, and one part of the divided light beam is inverted in position by a combination of prisms and lenses to be combined to the other part of the divided light beam for compensating non-homogeneity in the original light beam.

And in a Japanese Utility Application which was laid open under Provisional Utility Publication No. 124212/88, a homogenizer is composed of a matrix of optical fibers.

As described, homogenizers of prior art comprises lenses, prisms or optical fibers, and have a fairy long light path in glass material. When a light source of a short wavelength, such as an ArF exima laser light source, is used for the purpose of obtaining high resolution, light energy absorbed in the glass material will become large and loss of light intensity will become appreciable. And the glass material in a homogenizer might be damaged by heat generated from loss in the glass material.

SUMMARY OF THE INVENTION

Therefore, an object of the present invention is to provide a homogenizer in which no glass material is used.

Another object of the present invention is to provide a light beam transformer in which no glass material is used, and still another object of the present invention is to provide an optical illumination instrument adapted to be used as an illuminator for photolithographic process.

In order to achieve these objects, paraboloid mirrors are used in this invention for focusing light beam. In a homogenizer of this invention, an array of small paraboloid mirrors is used to form a number of secondary light sources, and in a light beam transformer of this invention, a combination of two paraboloid mirrors is used. Reflection coefficient of a mirror can be made sufficiently high, which means that an absorption loss at a mirror surface can be made sufficiently small.

In a preferred embodiment of this invention, an optical illumination instrument comprises:
  a reflection type homogenizer comprising a number of paraboloid mirrors of a same size arranged on a same plane.
  a light beam transformer composed of a first paraboloid mirror for focusing parallel light beam to its focal point, and a second paraboloid mirror with its focal point placed at the focal point of the first paraboloid mirror for reflecting light beam from the focal point of the first paraboloid mirror as parallel light beam of a size suitable for illuminating the reflection type homogenizer, and
  an illumination lense for illuminating a reticle by light reflected from the reflection type homogenizer.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 3:
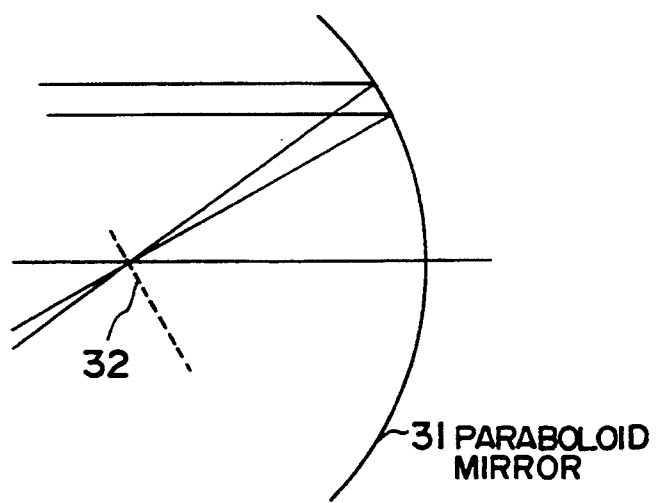
FIG. 3 shows a schematic diagram illustrating light path at a paraboloid mirror.

Referring to FIG. 3, a paraboloid surface 31 has a focal point 32. Parallel light beam incident to the paraboloid surface 31 is focused at the focal point 32. And a light beam from a point light source placed at the focal point 32 is reflected at the surface of the paraboloid mirror 31 forming parallel light beam.

Figure 2:
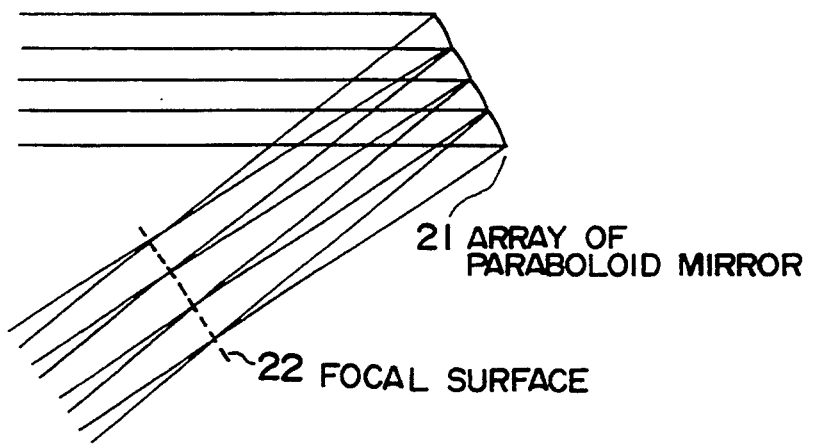
FIG. 2 shows a schematic diagram of a homogenizer of this invention.
Figure 4:
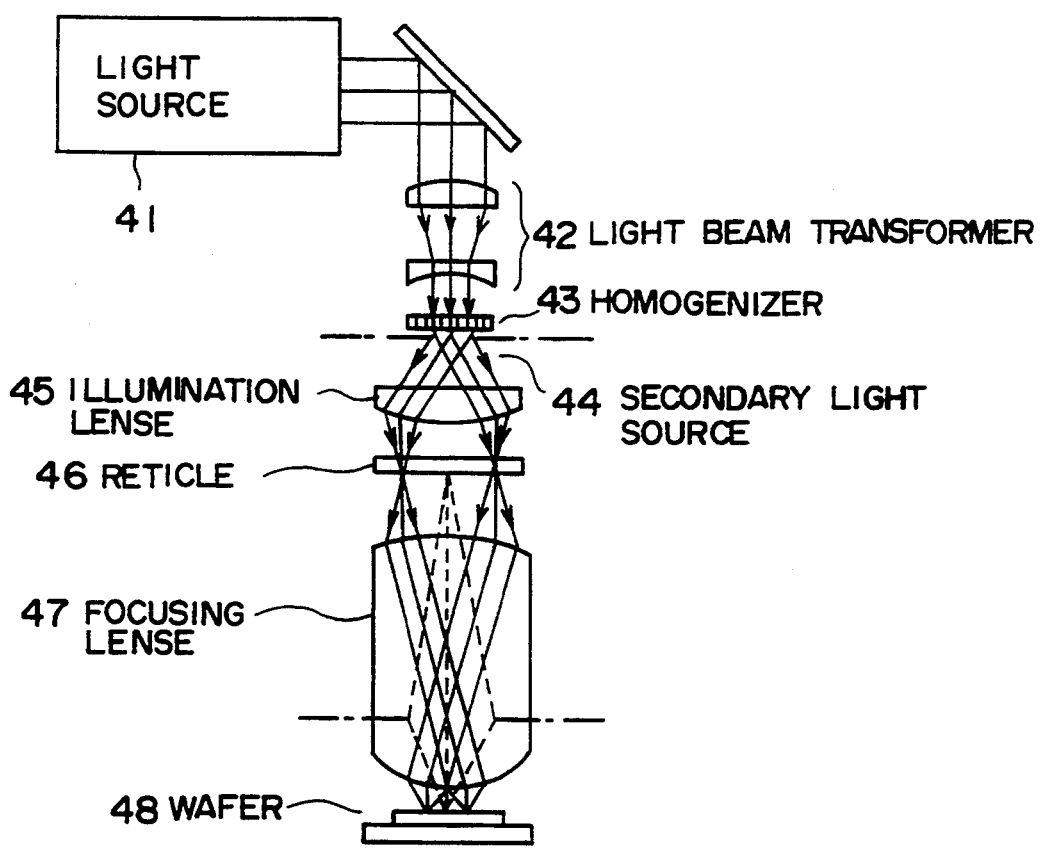
FIG. 4 shows a schematic diagram of an optical illuminator of a prior art.

Referring to FIG. 2, parallel light beam is incident to an array of small paraboloid mirrors 21. Each small paraboloid mirror focuses light beam incident to the mirror to its focal point. A secondary light source which is a point where light beam is focused by a small paraboloid mirror, is formed. Since small paraboloid mirrors of a same size are arranged on a same plane, an array of secondary light sources are formed on a focal surface 22. This is equivalent to secondary light sources 44 of FIG. 4. Therefore the arrangement shown by FIG. 2, can be used as a homogenizer and is called a reflection type homogenizer.

Figure 1:
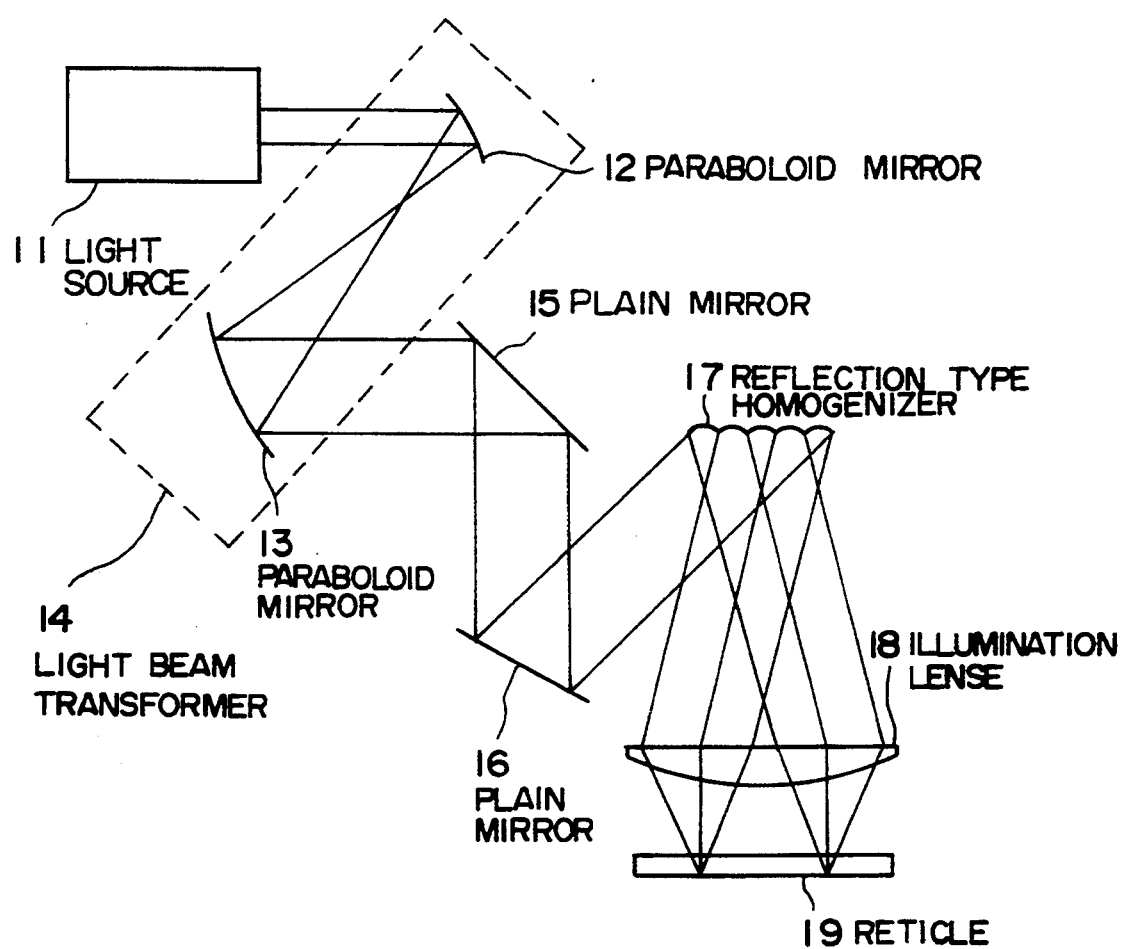
FIG. 1 shows a schematic diagram of an embodiment of this invention.

Now referring to FIG. 1, an optical illumination instrument of this invention used for photolithographic process is illustrated. A light source 11 corresponds to the light source 41 of FIG. 4, an illumination lense 18 corresponds to the illumination lense 45 of FIG. 4, and a reticle 19 corresponds to the reticle 46 of FIG. 4. A focusing lense corresponding to the focusing lense 47 and a wafer corresponding to the wafer 48 are not shown in FIG. 1.

In FIG. 1, a paraboloid mirror 12 and a paraboloid mirror 13 constitute a light beam transformer 14. Parallel light beam from the light source 11 is focused to a focal point of the paraboloid mirror 12. The focal point of the paraboloid mirror 13 is aligned to that of the paraboloid mirror 12. Thus, the light beam focused by the paraboloid mirror 12 is transformed to parallel beam by the paraboloid mirror 13. In this transformation, size of the beam is transformed owing to the difference of focal distance of the two paraboloid mirrors.

Thus a parallel light beam of an adequate size goes out from the light beam transformer 14.

Direction of the parallel beam is changed by plane mirrors 15 and 16, and the parallel beam falls on a surface of a reflection type homogenizer 17. As described in connection with FIG. 2, the homogenizer 17 forms a number of secondary light sources, and radiations from these secondary light sources enter into the illumination lense 18. Thus, the reticle 19 is illuminated uniformly. Path of the light beam from the reticle 19 to an wafer is same with that in the instrument shown by FIG. 4

As is apparent from FIG. 1, there is no glass material in light path from output of the light source 11 to input of the illumination lense 18, and there is no transmission loss of light. Reflection loss of light in the light beam transformer 14 and the reflection type homogenizer 17 is small, and illumination light is efficiently transmitted to the reticle.

I claim:

1. An optical illumination instrument comprising a reflection type homogenizer composed of an array of paraboloid mirrors and a light beam transformer for transforming a light beam to a suitable size for illuminating said reflection type homogenizer, wherein said light beam transformer comprises a first paraboloid mirror for focusing a parallel light beam received at its focal point, and a second paraboloid mirror with its focal point placed at the focal point of said first paraboloid mirror for reflecting said light beam from said focal point of said second paraboloid mirror to form a parallel light beam.

2. An optical illumination instrument comprising:
   a reflection type homogenizer comprising a number of paraboloid mirrors of a same size arranged on a same plane,
   a light beam transformer composed of a first paraboloid mirror for focusing a parallel light beam at its focal point, and a second paraboloid mirror with its focal point placed at the focal point of said first paraboloid mirror for reflecting a light beam from the focal point of said first paraboloid mirror as a parallel light beam of a size suitable for illuminating said reflection type homogenizer, and
   an illumination lense for illuminating a reticle by light reflected from said reflection type homogenizer.

* * * * *